US012669528B1

(12) United States Patent  (10) Patent No.:  US 12,669,528 B1

Carley et al.  (45) Date of Patent:  Jun. 30, 2026

(54) METHOD FOR TESTING SHIELDING EFFECTIVENESS OF A HEMP/EMI ENCLOSURE

(71) Applicant: Raytheon Company, Arllington, VA (US)

(72) Inventors: Ryan William Carley, Hopkinton, MA (US); Michael L. Mcfeeters, Wilmington, MA (US); John B. Rivera-Poventud, Clinton, MA (US); Travis Klipp, Watertown, MA (US)

(73) Assignee: Raytheon Company, Arlington, VA (US)

( * ) Notice: Subject to any disclaimer, the term of this patent is extended or adjusted under 35 U.S.C. 154(b) by 221 days.

(21) Appl. No.: 18/444,126

(22) Filed: Feb. 16, 2024

(51) Int. Cl.
G01R 29/08    (2006.01)
H05K 9/00    (2006.01)

(52) U.S. Cl.
CPC ....... G01R 29/0871 (2013.01); H05K 9/0049 (2013.01)

(58) Field of Classification Search
CPC .......................... G01R 29/0871; H05K 9/0049
See application file for complete search history.

(56) References Cited

U.S. PATENT DOCUMENTS

| | | | |
|---|---|---|---|
| 2,752,440 A | 6/1956 | Robbins | |
| 2,968,710 A | 1/1961 | Horberg, Jr. | |
| 4,962,358 A | * 10/1990 | Svetanoff | G01R 29/0835 |
| | | | 324/95 |
| 5,153,524 A | 10/1992 | McCormack | |
| 5,289,347 A | 2/1994 | McCarthy et al. | |
| 5,391,083 A | 2/1995 | Roebuck et al. | |
| 5,711,679 A | 1/1998 | Spickler et al. | |
| 5,920,064 A | 7/1999 | Rogers | |
| 5,941,725 A | 8/1999 | Brennan et al. | |
| 6,174,176 B1 | 1/2001 | Hong | |
| 6,295,410 B1 | 9/2001 | Helms et al. | |
| 6,384,357 B1 | 5/2002 | Morrison | |

(Continued)

FOREIGN PATENT DOCUMENTS

| CN | 108562767 A | 9/2018 |
|---|---|---|
| DK | 3707792 T2 | 9/2023 |

(Continued)

OTHER PUBLICATIONS

William Radasky et al. "High-Frequency Protection Concepts for the Electric Power Grid", Metatech Corporation, 358 S. Fairview Ave., Suite E, Goleta, CA 93117, Jan. 2010.

*Primary Examiner* — Stephanie E Bloss
*Assistant Examiner* — Michael A Harrison
(74) *Attorney, Agent, or Firm* — Suiter Swantz IP

(57)    ABSTRACT

A HEMP enclosure includes a recessed coaxial connector interface. The connector interface is located at the bottom of a metallic tube in the chassis wall that functions as a waveguide below cutoff (WBC). The WBC attenuates the electromagnetic pulse threat signal to a benign level when the transmitter enclosure is not inserted for testing. Internal to the chassis, the connector interface includes an omni-directional antenna. A transmitter enclosure includes a wand to plug the transmitter into the connected interface. The transmitter generates an RF signal at a desired frequency range that is then transmitted via a coaxial cable in the wand to the antenna in the chassis.

14 Claims, 2 Drawing Sheets

(56)             References Cited

U.S. PATENT DOCUMENTS

| | | | |
|---|---|---|---|
| 6,682,368 | B2 | 1/2004 | Murr et al. |
| 7,479,042 | B2 | 1/2009 | Chen |
| 8,217,739 | B2 | 7/2012 | Wu |
| 9,124,956 | B2 | 9/2015 | Heimann et al. |
| 9,190,837 | B2 | 11/2015 | Tollefsbol et al. |
| 11,350,548 | B2 | 5/2022 | Easton et al. |
| 11,450,990 | B2 | 9/2022 | Demaratos et al. |
| 11,749,950 | B2 | 9/2023 | Chen et al. |
| 2005/0128741 | A1 | 6/2005 | Matthews et al. |
| 2005/0181645 | A1 | 8/2005 | Ni et al. |
| 2010/0216398 | A1 * | 8/2010 | Finn ...................... B64D 47/00 |
| | | | 455/41.2 |
| 2014/0209438 | A1 | 7/2014 | Wavering |
| 2015/0173255 | A1 | 6/2015 | Manto et al. |
| 2016/0141584 | A1 | 5/2016 | Eichorn |
| 2017/0346322 | A1 | 11/2017 | Kuran et al. |
| 2022/0201907 | A1 | 6/2022 | Trent |
| 2022/0201908 | A1 | 6/2022 | Boyd et al. |
| 2022/0412077 | A1 | 12/2022 | Ford et al. |
| 2023/0216132 | A1 | 7/2023 | Guo et al. |

FOREIGN PATENT DOCUMENTS

| | | | |
|---|---|---|---|
| EP | 0106432 | A1 | 4/1984 |
| EP | 3051634 | B1 | 1/2020 |
| KR | 101316542 | B1 | 10/2013 |

* cited by examiner

METHOD FOR TESTING SHIELDING EFFECTIVENESS OF A HEMP/EMI ENCLOSURE

BACKGROUND

Designing enclosures to meet high altitude electromagnetic pulse (HEMP) requirements includes the ability to ensure that the unit retains its shielding effectiveness over time and use. This is a challenge for enclosures without easily accessible panels or smaller enclosures that cannot fit bulky test equipment internal to the enclosure.

SUMMARY

In one aspect, embodiments of the inventive concepts disclosed herein are directed to a HEMP enclosure having a recessed coaxial connector interface. The connector interface is located at the bottom of a metallic tube in the chassis wall that functions as a waveguide below cutoff (WBC). The WBC attenuates the electromagnetic pulse threat signal to a benign level when the transmitter enclosure is not inserted for testing. Internal to the chassis, the connector interface includes an omni-directional antenna.

In a further aspect, a transmitter enclosure includes a wand to plug the transmitter into the connected interface. The transmitter generates an RF signal at a desired frequency range that is then transmitted via a coaxial cable in the wand to the antenna in the chassis.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
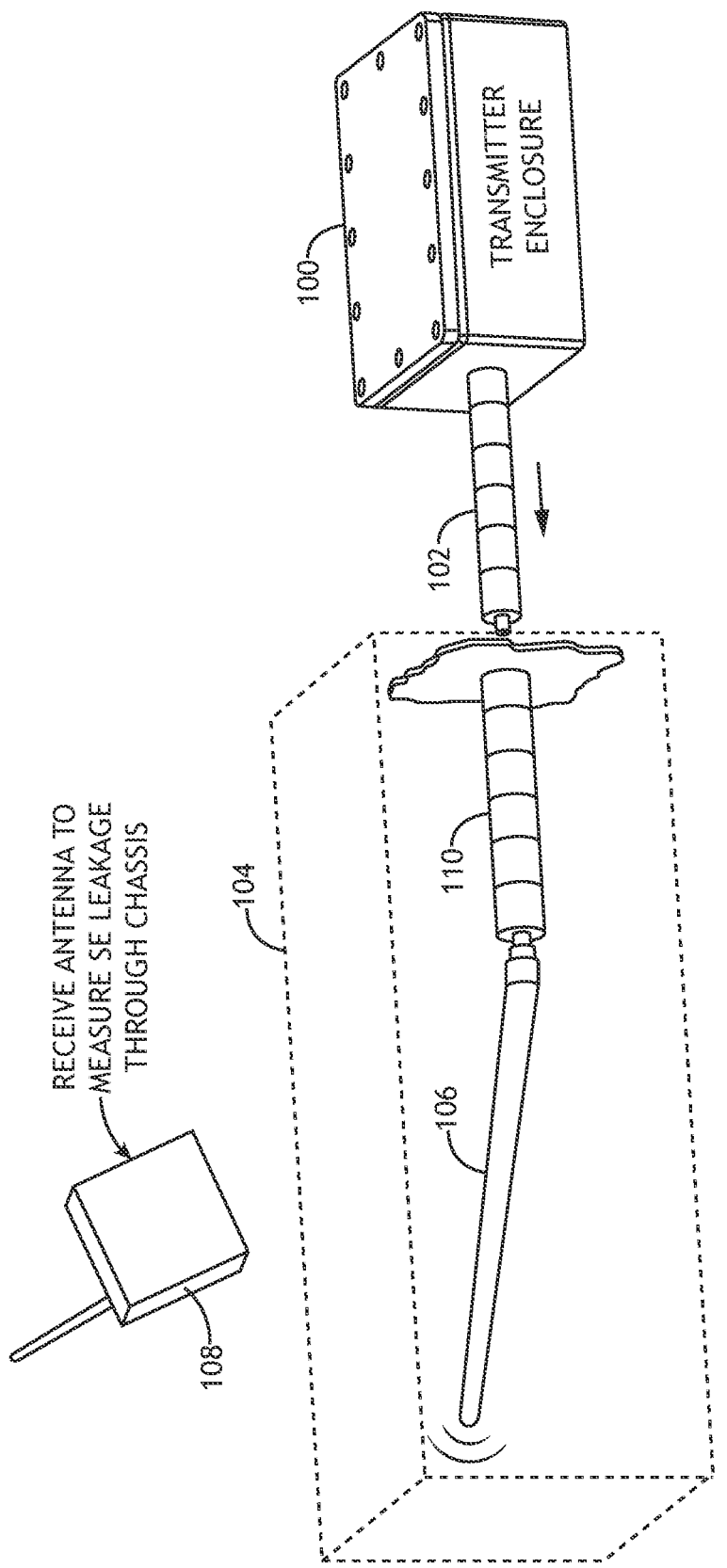
FIG. 1 shows a perspective view of a HEMP enclosure according to an exemplary embodiment.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of a feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement. Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed to a HEMP enclosure having a recessed coaxial connector interface. The connector interface is located at the bottom of a metallic tube in the chassis wall that functions as a waveguide below cutoff (WBC). The WBC attenuates the electromagnetic pulse threat signal to a benign level when the transmitter enclosure is not inserted for testing. Internal to the chassis, the connector interface includes an omni-directional antenna. A transmitter enclosure includes a wand to plug the transmitter into the connected interface. The transmitter generates an RF signal at a desired frequency range that is then transmitted via a coaxial cable in the wand to the antenna in the chassis.

Referring to FIG. 1, a perspective view of a HEMP enclosure 104 according to an exemplary embodiment is shown. The HEMP enclosure 104 comprises a metallic tube 110 and an antenna 106 disposed at a distal end of the metallic tube 110. The metallic tube 110 includes a connector interface to allow a separate transmitter to interface with the antenna 106. The transmitter applies a signal to the antenna 106 and a receiver 108 external to the HEMP enclosure 104 monitors for the signal to ensure the HEMP enclosure 104 is successfully shielding the internal environment.

In at least one embodiment, a testing system includes a transmitting device adapted to engage the metallic tube 110 of the HEMP enclosure 104. The transmitting device includes a transmitter enclosure 100 comprising a shielded enclosure to contain a transmitter. A wand structure 102 is disposed to engage the metallic tube 110.

During testing, the wand structure 102 engages the metallic tube 110 to connect the transmitter to the antenna 106. The metallic tube 110 comprises a WBC to prevent leakage at the interface.

It may be appreciated that while the embodiment illustrated shows a transmitter enclosure 100 that generates a signal at the antenna 106, and an outside receiver monitoring for leakage signals, the principals are equally applicable where the transmitter is external to the system, and the antenna 106 monitors for leakage signals from inside the HEMP enclosure 104. A receiver would engage the antenna 106 through the metallic tube 110, and an EMI viewing window may display any identified leakage signal.

Figure 2:
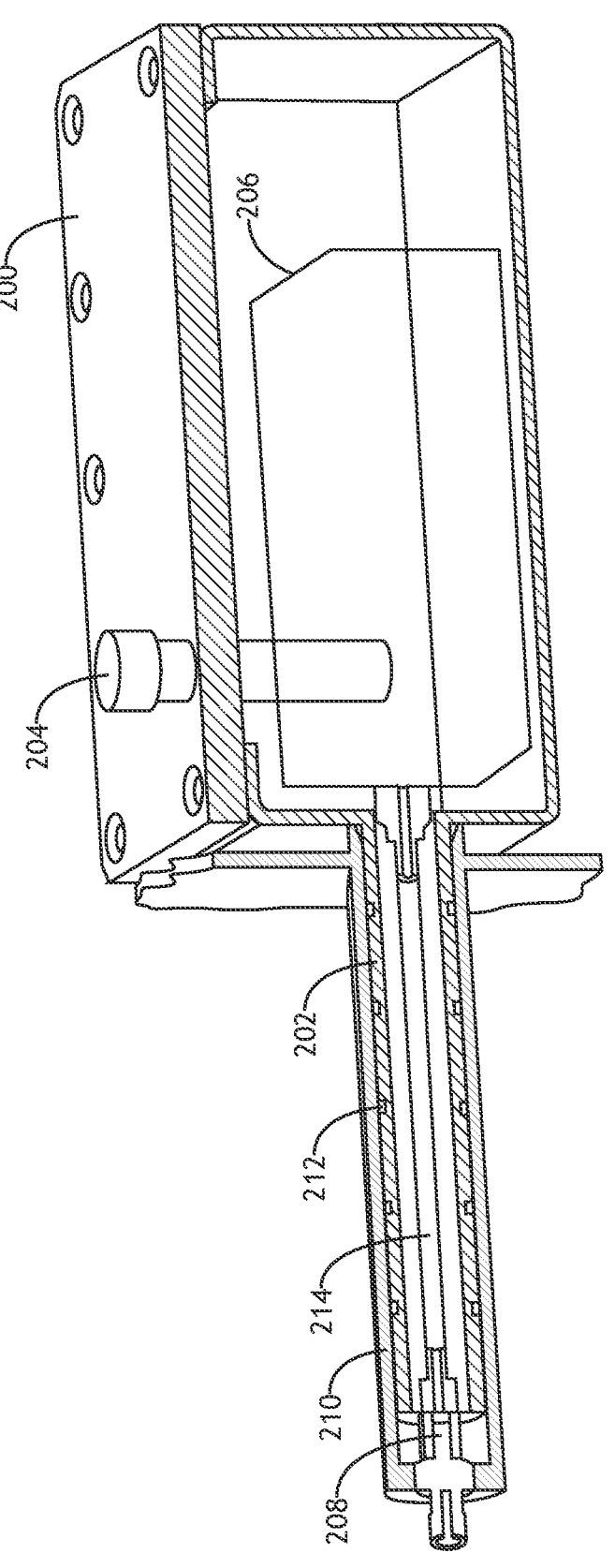
FIG. 2 shows a perspective, cross-sectional view of a HEMP enclosure metallic tube according to an exemplary embodiment, and a transmitting device is shown.

Referring to FIG. 2, a perspective, cross-sectional view of a HEMP enclosure metallic tube 210 according to an exemplary embodiment, and a transmitting device 200 is shown. During testing, a wand structure 202 of the transmitting device 200 is inserted into a metallic tube 210 of the HEMP enclosure being tested. The metallic tube 210 includes an internal interface 208 to allow a corresponding interface at a distal end of the wand structure 202 to engage an antenna within the HEMP enclosure. If the internal interface 208 were disposed directly on the surface of the HEMP enclosure, it would create a threat from an EMI standpoint, because an outside threat could propagate through such interface.

A transmitter 206 then applies a signal to the antenna via a cable 214 (e.g., a coaxial cable) within the wand structure. The transmitter 206 may be manipulated via an external control 204.

In at least one embodiment, one or more EMI gaskets 212 may be disposed along the length of the wand structure 202 to prevent leakage (such as RF leakage) through the test interface.

Embodiments of the present disclosure enable testing of a HEMP enclosure, without compromising the HEMP enclosure, and without the need to carry a transmitter, batteries, and electronics within the HEMP enclosure. Such components would be used very infrequently and create an additional expense during manufacture. Separating the testing transmitter from the HEMP enclosure saves weight, space, and maintenance. The metallic structure WBC is long enough to mitigate any EMI signals leaking inside the box when the transmitter enclosure is not inserted for testing.

Embodiments of the present disclosure provide the ability to generate an RF signal inside of a shielded enclosure without having to include the transmitter in the enclosure. The transmitter is only connected to the enclosure when shield leak testing is to be performed. When disconnected, the geometry of the interface acts as a WBC and protects the interface from external HEMP threats.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. A HEMP enclosure comprising:
   a shielded enclosure case;
   a metallic tube disposed to extend from an external opening, internally within the shielded enclosure;
   one or more EMI gaskets disposed within the metallic tube; and
   wherein the metallic tube is configured to receive a wand structure of a separate transmitting device or receiving device.

2. The HEMP enclosure of claim 1, further comprising:
   an internal interface disposed at a terminus of the metallic tube distal to the external opening; and
   an antenna disposed at an internal terminus of the metallic tube, within the shielded enclosure.

3. The HEMP enclosure of claim 2, wherein the metallic tube comprises a waveguide below cutoff.

4. The HEMP enclosure of claim 1, wherein the metallic tube comprises a waveguide below cutoff.

5. A transmitting device for testing HEMP enclosures comprising:
   a transmitter;
   a wand structure configured to engage a metallic tube of a HEMP enclosure in electronic communication with the transmitter;
   an interface disposed at a distal end of the wand structure, the interface configured to engage an internal interface in the metallic tube of the HEMP enclosure; and
   one or more EMI gaskets disposed along the wand structure.

6. The transmitting device of claim 5, further comprising an antenna disposed at a distal end of the wand structure.

7. The transmitting device of claim 6, further comprising one or more EMI gaskets disposed along the wand structure.

8. A testing system comprising:
   A HEMP enclosure comprising:
      a shielded enclosure case;
      a metallic tube disposed to extend from an external opening, internally within the shielded enclosure; and
      one or more EMI gaskets disposed within the metallic tube; and
   A transmitting device for testing HEMP enclosures comprising:
      a transmitter;
      a wand structure in electronic communication with the transmitter, the wand structure comprising an interface disposed at a distal end of the wand structure, the interface configured to engage an internal interface in the metallic tube of the System; and
      one or more EMI gaskets disposed along the wand structure.

9. The system of claim 8, the HEMP enclosure further comprising:
   an internal interface disposed at a terminus of the metallic tube distal to the external opening; and
   an antenna disposed at an internal terminus of the metallic tube, within the shielded enclosure.

10. The system of claim 9, wherein the metallic tube comprises a waveguide below cutoff.

11. The system of claim 8, wherein the metallic tube comprises a waveguide below cutoff.

12. The system of claim 8, further comprising one or more EMI gaskets disposed within the metallic tube.

13. The system of claim 8, the transmitting device further comprising an antenna disposed at a distal end of the wand structure.

14. The system of claim 13, further comprising one or more EMI gaskets disposed along the wand structure.

\* \* \* \* \*